United States Patent [19]

Doriath et al.

[11] Patent Number: 4,516,073
[45] Date of Patent: May 7, 1985

[54] MAGNETOMETER PROBE USING A THIN-FILM MAGNETIC MATERIAL AS A MAGNETO-OPTIC SENSOR

[75] Inventors: Gérard Doriath; Roger Gaudry, both of Paris, France

[73] Assignee: Thomson-CSF, Paris, France

[21] Appl. No.: 424,617

[22] Filed: Sep. 27, 1982

[30] Foreign Application Priority Data

Dec. 4, 1981 [FR] France .................. 81 22745

[51] Int. Cl.³ .............................................. G01R 33/02
[52] U.S. Cl. ...................... 324/244; 324/96; 350/377
[58] Field of Search ............... 324/244, 246, 250, 96, 324/117; 350/375-378; 356/356; 372/105

[56] References Cited

U.S. PATENT DOCUMENTS

| 4,356,448 | 10/1982 | Brogardh et al. | 324/244 |
| 4,370,612 | 1/1983 | Puech et al. | 324/117 R |
| 4,449,096 | 5/1984 | Doriath et al. | 324/244 |

FOREIGN PATENT DOCUMENTS

| 0000638 | 2/1979 | European Pat. Off. . |
| 0046298 | 2/1982 | European Pat. Off. . |
| 2355299 | 1/1973 | France . |
| 2170141 | 9/1973 | France . |
| 1121423 | 7/1968 | United Kingdom . |

OTHER PUBLICATIONS

Jaecklin, Andre A., "Measuring Current at Extra-high Voltage", Laser Focus, May 1970, pp. 35-38.

*Primary Examiner*—Gerard R. Strecker
*Assistant Examiner*—Warren S. Edmonds
*Attorney, Agent, or Firm*—Oblon, Fisher, Spivak, McClelland & Maier

[57] ABSTRACT

A magnetometer measuring head is divided into two separate sub-units, including a first sub-unit including means for transmission and detection of polarized light is coupled via a fibre to a second sub-unit comprising a thin layer of magnetic material within which is guided the light wave transmitted by the fibre. The coupling with the fibre is established via the edge, the opposed end of the layer being provided with a mirror so that the guided wave follows an outgoing and returning path before being retransmitted to the detection means which measure the rotation of the polarization of the light caused by Faraday effect.

14 Claims, 6 Drawing Figures

MAGNETOMETER PROBE USING A THIN-FILM MAGNETIC MATERIAL AS A MAGNETO-OPTIC SENSOR

BACKGROUND OF THE INVENTION

The present invention relates to a magnetometer measuring head and to a magnetometer comprising such a head.

U.S. Pat. No. 4,112,367 discloses a magnetometer utilising the Faraday effect in thin layers of particular materials such as Yttrium and iron garnet commonly called YIG. In this magnetometer, a light beam produced by a laser is propagated in a thin layer having a thickness of a few micrometers. This beam is propagated in guided manner according to a single mode, for example the transverse magnetic mode (TM). To select this mode, and taking into account the small thickness of the layer, this beam has to be made to penetrate into this layer by means of a coupling prism. Under the action of the magnetic field permeating the thin layer, the propagation mode is partially converted into the transverse electric mode (TE). For extracting the beam from the layer, use is made of a prism of birefringent material supplying two angularly separated beams; the one corresponding to the TE mode and the other to the TM mode. The strength of the beam corresponding to the TE mode is a function of the strength of the magnetic field permeating the thin layer. Since this is not a linear function, a zeroing method is utilised to perform the measuring operation, which consists in compensating within the thin layer of the field which is to be measured by an opposed adjustable field generated by a coil. To detect this compensating action, this direct field has superimposed on it an alternating field which within the beam corresponding to the TE mode causes the appearance of a modulation which when the balancing operation is effected, contains only even harmonics of the frequency of the alternating field since the Faraday effect depends on the value of the magnetic field and not on its direction. If the compensation is not carried out, odd components and in particular the fundamental component, are detected in the modulated beam and these components are utilised to control a servo mechanism which adjusts the compensating field so as to secure the disappearance of these odd components.

Although the measuring layer is of small size, the associated elements needed to utilise the same are much bulkier and delicate to adjust. Furthermore, the single-mode propagation requires a high-power laser and thus one of large size as a light source. Finally the angular separation of the beams coming from the output prism is not very great and requires the detector to be positioned sufficiently far away to be energised only by the single beams selected.

In order to overcome these prior art disadvantages, a special system is described in French patent application No. 2,471,608, which corresponds to U.S. Pat. No. 4,449,096, enabling to obtain a head of small size able to measure the magnetic field in narrow spaces and enabling the plotting magnetic gradient charts. To this end, the magnetic material thickness is selected so as to allow multimode guide propagation of the beam and, in cooperation with the beam transmission mans and the rotation measuring means, the entry and exit of the beam via the edge of the layer.

Whilst retaining the advantages of this device, the present invention proposes a modified measuring head structure simultaneously increasing the useful mensuration distance, simplifying the mounting of the head and reducing its dimensions.

SUMMARY OF THE INVENTION

The first aim of the invention is accomplished by causing the beam to travel outwards and back within the thin layer of magnetic material, the Faraday effect not depending on the direction of propagation of the guided wave.

The second aim may be accomplished by separating the actual measuring probe, essentially formed by the thin layer of magnetic material, from the light transmission-reception elements. These two sub-assemblies are coupled by an optical fibre, specifically eliminating the difficulties of precisely positioning the detection element formed by a photodiode.

The third aim may in particular be attained by replacing the permanent magnets or analogous means of inducing a transverse magnetic field in the magnetic material layer with electrodes situated on this layer.

The invention provides a measuring head for a magnetometer of the kind comprising means for the transmission of a beam of linearly polarised light, a plane layer of a magnetic material for guided propagation within the same of said beam parallel to the plane surfaces of said material and for rotating its direction of polarisation during the propagation, and means for measuring this rotation; the thickness of the magnetic material layer being selected so as to allow guided propagation of the beam, in which the said means for transmission of the light beam and for measuring the rotation are coupled to one of the ends of the plane layer of magnetic material, via its edge, by means of a common optical fibre and in which the opposite extremity of the layer is provided with means for reflecting the guided beam, in such a manner as to cause the same to travel outward and back within the magnetic material layer before reinjection into the common optical fibre and transmission to the means for measuring the rotation of the direction of polarisation.

The invention also relates to a magnetometer comprising a head of this kind.

BRIEF DESCRIPTION OF THE DRAWINGS

A clearer understanding of the invention will be obtained and other features will appear from the following description and with reference to the accompanying drawings in which.

DESCRIPTION OF THE PREFERRED EMBODIMENTS

Figure 1:
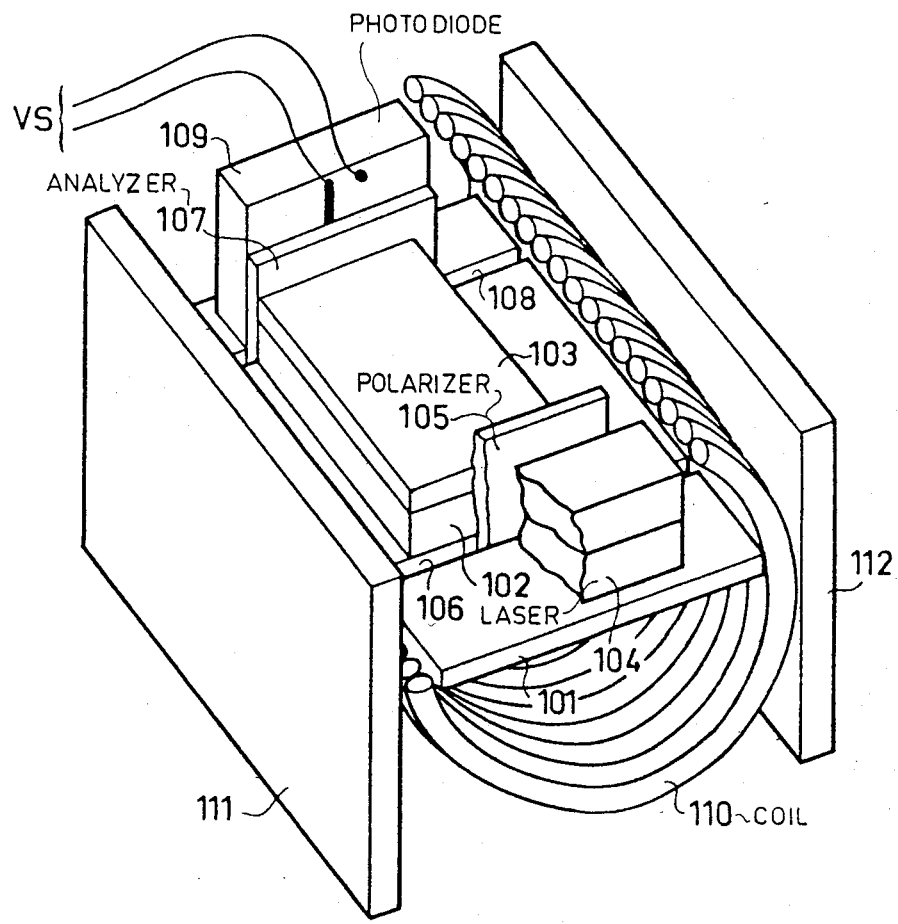
FIG. 1 illustrates a cutaway view of a measuring head according to French patent application No. 2,471,608.

Firstly, it is useful to recall the arrangement of a magnetic head according to the prior art, as exemplified by the French patent application No. 2,471,608. This system is shown in FIG. 1.

The magnetometer head shown in this figure comprises a ceramic plate 101 acting as a support for the active elements of the head. On the middle of this plate has been glued a smaller plate 102 cut from a Gadolinium and Gallium garnet referred to as GGG, its dimensions in length × width × thickness amount to approximately 10 × 3 × 0.7 mms. On the GGG surface is caused to grow by epitaxy a comparatively thick layer 103 of YIG substantially corresponding to the composition $Gd_{0.45}Y_{2.55}Fe_{4.1}O_{12}$. The thickness obtained may lie between 5 and 110 microns and 20 microns is a typical value.

Such a thickness of YIG permits propagation of the light in guided but multimode manner, and in these conditions the Faraday effect caused by the magnetic field manifests itself only by a rotation of the plane of polarisation of the light and no longer by a conversion of the TM mode into the TE mode. This permits coupling the light beam via the terminal surfaces of the YIG layer.

However, to secure this coupling, these input and exit surfaces should be as perfect as possible. It is commonly impossible to find a cleavage plane because of the uneven nature of the material. A polishing operation on these surfaces then becomes mandatory.

Differently known methods may be employed and amongst these, the process described in detail in the above patent application which need not be recalled here.

The light source consists of a laser diode 104 secured on the plate 101 in such a manner that its junction through whose edge issued the coherent light beam is substantially positioned at the centre of the YIG layer. The transmission surface of such a diode has a thickness of substantially 0.2 micrometers and a width of 15 micrometers. This diode is supplied with an appropriate electric voltage VE by means of two input connections.

A polariser 105 has been placed between the laser diode and the substrate carrying the YIG layer, which permits linear polarisation of the light emitted by the laser diode into the YIG layer. For example, this polariser is cut from a polarising film of a kind in current use in optics. Its thickness is such that it does not disturb the coupling between the emissive diode and the YIG layer, provided that care is taken to grip the polariser in moderate manner between the diode and the plate 102. A groove 106 formed in the plate 101 facilitates the fitting of the polariser.

An analyser 107 analogous to the polariser 105 but cross-mounted as compared to the latter and immobilised in another mounting slot 108, has been positioned at the other end of the plate 102.

This analyser is lightly gripped between the plate 102 and a detector photodiode 109. For example, this photodiode is of the germanium type exposed to a reverse bias of some ten volts and its active surface is produced substantially in the form of a rectangle to intercept the maximum of light emerging from the YIG layer. Under these conditions, an electrical output signal VS is collected which represents the luminous energy detected.

The board 101 and the set of active elements it carries are placed within a solenoid 110 which permits to apply the magnetic balancing field and the alternating measuring field.

For measuring the Faraday effect in the YIG layer, the initial magnetisation of this layer should be transverse to the direction of propagation of the light in the same. To this end, means have to be used which induce this transverse field with a value of approximately $10^{-2}$ amp-turns/meter. For example, these means are permanent magnets illustrated in FIG. 1 in the form of blocks 111 and 112. If the value of this field is intended to be optimised in accordance with the sensitivity which is to be secured, it is equally possible to use Helmholtz coils instead of these magnets 111 and 112.

Although an efficient and small size measuring head may be obtained by means of the structure adopted, its overall dimensions being of the order of the largest dimension of the plate 101, namely approximately 1 cm, its performance may be increased and its dimensions reduced whilst retaining the advantages of this system.

For this purpose, the invention proposed a structure in which the elements are differently arranged from the foregoing.

Figure 2:
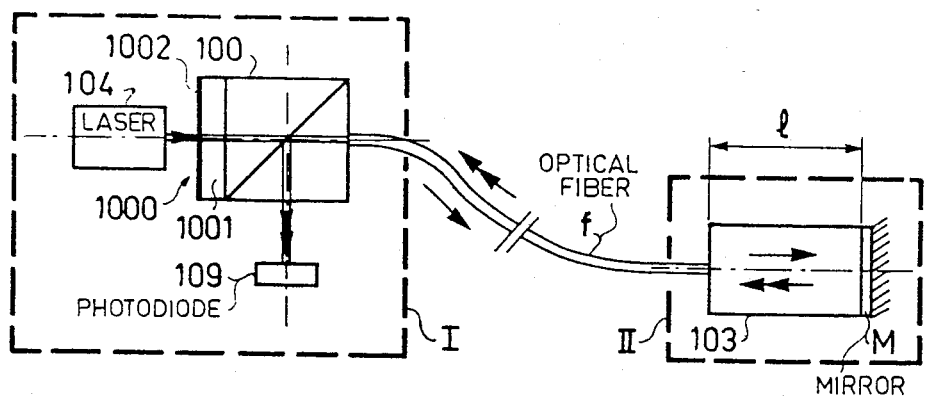
FIG. 2 illustrates the layout of an embodiment of measuring head according to the invention.

FIG. 2 diagrammatically illustrates a system according to the present invention. The components common to the measuring head of the earlier patent application and described with reference to FIG. 1 bear the same reference and will not be described again in particular.

The most important feature is the division into two separate sub-units of the components of the measuring head, these two sub-units being coupled by an optical fibre f of the single mode or multimode type.

The first sub-unit I comprises the light energy transmission-reception elements. Apart from a laser 104 and a detector 109, for example a photo-diode, it comprises means 100, for polarisation, separation of the polarisations and the analysis of the light transmitted and received to and from the optical fibre f coupled to the same.

In a preferred form of the invention, the means 100 may be formed by a cube made up of two prisms glued together and consisting of refractive material. The separation surface formed by the hypotenuse of the two prisms is treated in such a manner as to be a polarisation separator. This element has a preferential optical axis. The incidental rays are transmitted with a linear polarisation parallel to this axis and fed into the optical fibre f. The rays coming from the fibre f are split into two components having orthogonal directions of polarisation. The component having a direction of polarisation orthogonal to the preferential optical axis is wholly reflected along the direction of exit orthogonal to the direction of incidence, that towards the detector 109. The cube faces may moreover have undergone a surface treatment to prevent disturbing reflections. This treatment is known to those versed in the art.

Other optical elements may be used within the scope of the invention, particularly in the case of particular birefringent polarisers such as the GLAN prism. A polariser should however be selected which transmits the rays incident in a first direction of polarisation without alteration and totally reflects the rays having a direction of polarisation orthogonal to the preceding direction.

Finally, and more commonly, if the optical element providing separation by polarisation does not polarise the rays, use may be made of a pair of polariser and analyser elements, for example analogous to those (105,107) employed in the measuring head described with reference to FIG. 1. Finally, some semiconductor lasers transmit an already polarised light beam. The polarising direction should then be made to coincide with the preferential optical axis of the cube 100 or of any other element acting as the latter.

In particular, it is equally desirable in this case to prevent the re-injection of the component unaffected by rotation in the active layer 103. To this end, in a preferred but not limiting modification, a separator 1000 comprising an element 1001 causing rotation of the polarisation through preferably π/4 radians and comprising a polariser 1002 on the entry surface having the same axis of polarisation as the direction of polarisation of the light transmitted by the laser source 104, is interposed between the laser source 104 and the cube 100. The polariser thus integrally transmits the light emitted. The element 1001 may comprise a block of YIG material causing rotation of the polarisation by Faraday effect and joined to the block 100.

The preferential optical axis of the cube 100 should be parallel to the new polarisation of the light as transmitted by the separator element. On the return path, the light which has not undergone rotation and has been retransmitted by the cube 100 to the block 1000 has its axis of polarisation turned again through π/4 radians. It follows that this disturbing component is eliminated by the polariser 1002.

The second sub-unit II forms the actual measuring probe.

Figure 3:
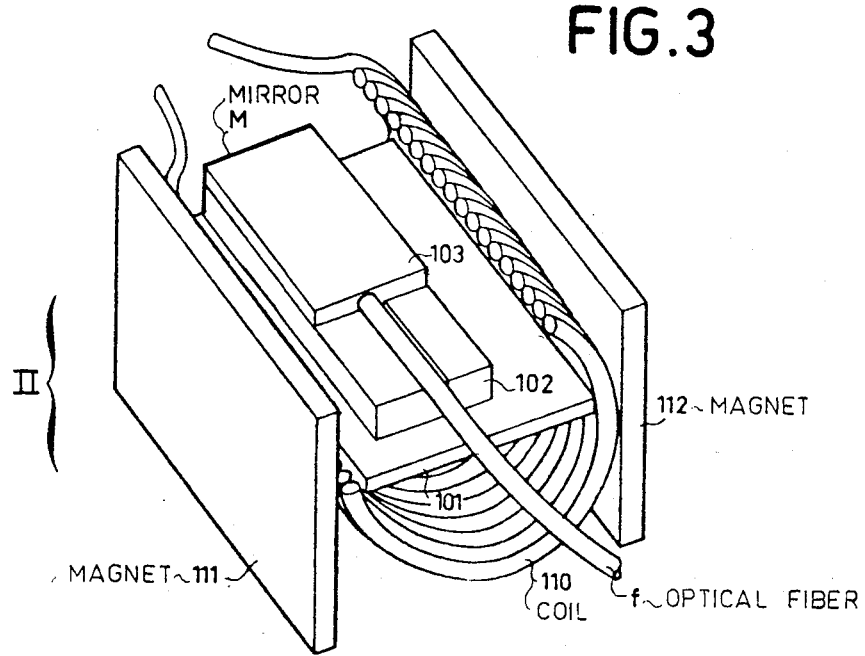
FIG. 3 is a practical embodiment of a particular sub-unit of this head.

A first practical embodiment of this sub-unit is illustrated in FIG. 3. It comprises the elements described in the foregoing, namely the support plate 101, the GGG plate 102, the layer of active material 103, the solenoid 110, as well as means 111 and 112 for applying a transverse magnetic field within the layer 103. As previously stated, these means may be formed by two permanent magnets.

Within the scope of the present invention, the intermediate plate 102 may be extended on the carrier and comprise a reference notch in which the optical fibre f is positioned to ensure satisfactory optical coupling between the same and the layer of active material 103. This coupling technique is well known to those versed in the art. Sealing means, which are not shown, are equally applied to secure the fibre after positioning the same. An index liquid may equally be used and inserted between the section and the optical fibre.

Finally, positioning may be provided by means integral with the support 101 and not with the plate 102 as shown.

Another important feature consists in the presence of a mirror M on the surface of the layer 103 opposite to the coupling surface with the optical fibre f.

This mirror M may simply be produced as a metallisation of the section 103. The overall operation of the measuring head is identical to that of the measuring head described in respect to FIG. 1. Under these conditions, referring to FIG. 2 again, the useful length to be taken into account no longer consists of the single length l of the layer 103. The Faraday effect being unaffected by the direction of propagation of the light wave, it is the doubled length 2 l which is applicable because of the outward and return travel of the wave caused by reflection on the mirror M. For an equal sensitivity, the layer 103 (and the plate 101 in similar proportions) may be reduced by half. In the contrary case, retaining identical dimensions for the layer 103, the sensitivity may be doubled.

The Faraday effect thus exposes the light wave to a rotation of polarisation of an amplitude twice that of the measuring head described in the foregoing, before being reinjected into the optical fibre f.

Upon issuing from the fibre f, the incident wave is split into two components having mutually orthogonal polarisations. Only the component having a direction of polarisation orthogonal to the preferential optical axis of the cube 100 will be reflected towards the detector 109.

This component represents the amplitude of the rotation caused by the Faraday effect.

Apart from the advantages listed, the arrangement of the measuring head according to the invention permits a particularly uncomplicated and compact design of the actual measuring probe section (sub-unit II) of the measuring head since only the optical fibre needs be positioned regarding the layer 103. Moreover, the light transmission-reception elements may be made stationary and the only connections to be made are for electrical supply to the solenoid 110 and optical coupling by means of a fibre f.

Figure 4:
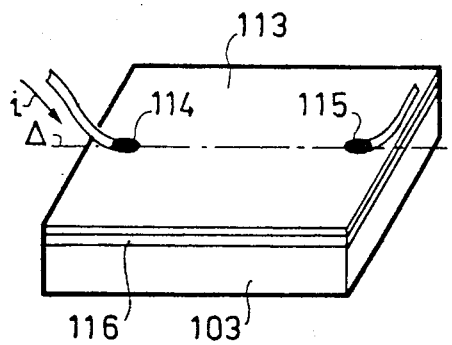
FIGS. 4 and 5 illustrate two modified forms of an element of this sub-unit.
Figure 5:
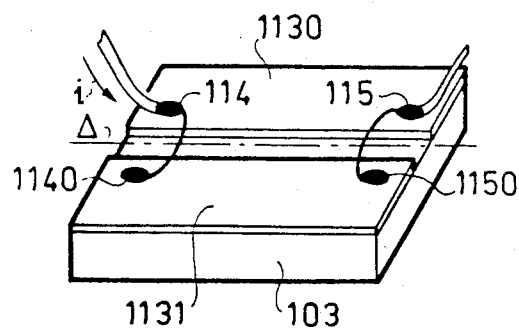

It is also possible to reduce the dimensions of the measuring probe sub-unit II in other modified forms illustrated in FIGS. 4 and 5. As a matter of fact, if the surface of the layer 103 is coated with an electrode traversed by a direct electric current i along a direction substantially parallel to the direction of propagation of the guided wave, the result corresponding to the laws of electromagnetism in the generation of a direct magnetic field of which the field lines within the material of the layer 103 are substantially parallel to the principal plane of this layer and orthogonal to the direction of propagation.

According to a first modified embodiment, illustrated by FIG. 4, this electrode 113 wholly covers the surface of the material 103. It may consist of a metallisation of the top surface of the layer.

Electrical connections 114 and 115 comprising external connecting wires traversed by the current i are provided at the two ends of the layer 103 in areas close to an axis Δ parallel to the direction of propagation of the wave and dividing this layer into two equal parts. To prevent weakening of the TM mode by interaction between the guided wave and the metal plate 113 thus formed, an intermediate layer 116 is provided, of a dielectric material of small thickness, typically of 1 μm.

To avoid this condition, in accordance with a second modified embodiment illustrated by FIG. 5, the electrode is divided into two sections 1130 and 1131, leaving uncovered the central strip wherein is substantially propagated the guided wave. There is thus no further interaction and the layer of dielectric material becomes superfluous. Complementary connections 1140 and 1150 provide electric continuity between the two sections of the electrode.

In a typical embodiment, with a layer 103 of a material having a thickness of 30 μm, a current i of approximately 25 mA is needed to generate a transverse magnetic field of the order of magnitude specified earlier: $-2$ amp-turns/meter.

Figure 6:
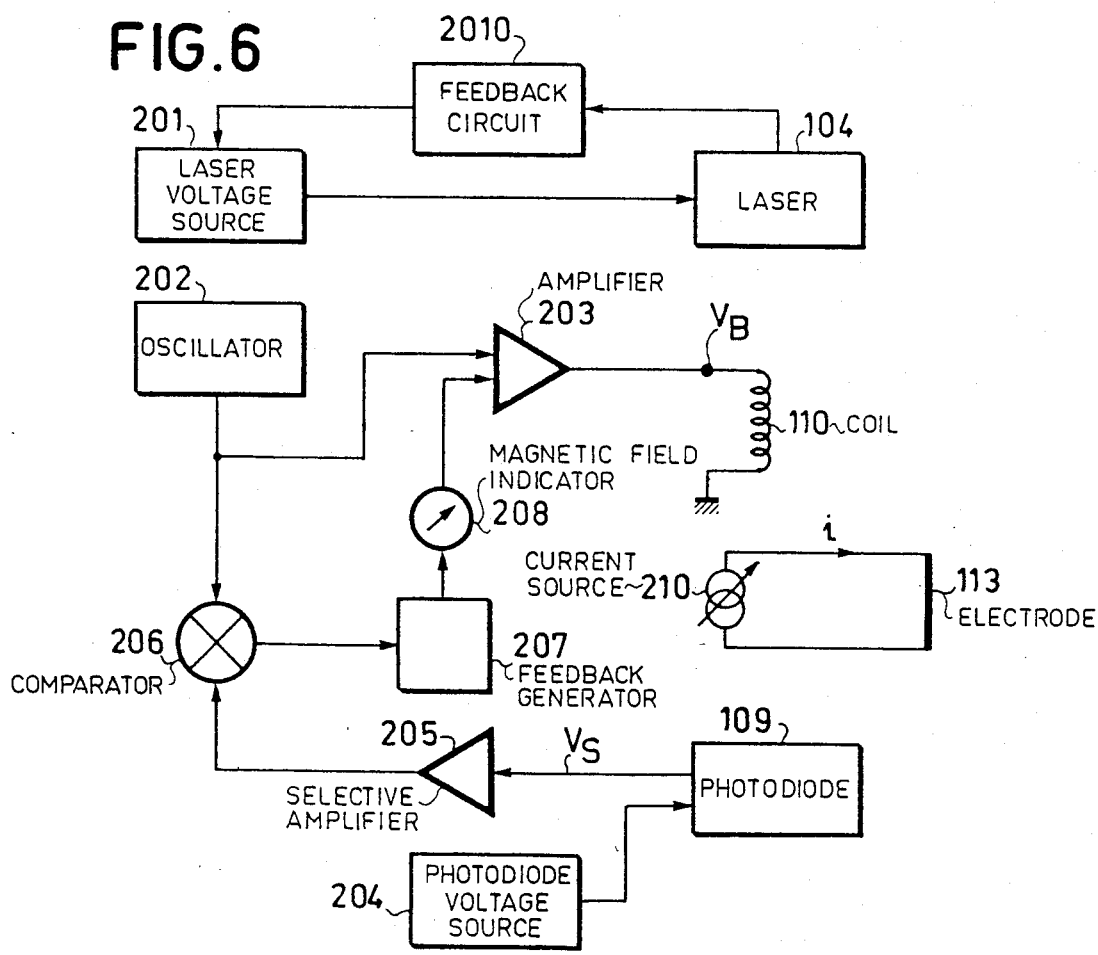
FIG. 6 is a simplified wiring diagram of the electric circuits associated with the measuring head.

The electronic circuits associated with the measuring head according to the modified forms described differ but little from those used within the scope of the aforementioned patent application and will be recalled briefly in the following. FIG. 6 illustrates a simplified wiring diagram of these circuits which may be housed within a case common to the transmission-reception elements: subunit I (FIG. 2).

Firstly, these circuits comprise a source of stabilised supply 201 which provides the power needed to feed the laser source 104. If this is a semiconductor laser, servo circuits 2010 are also provided, controlling the power emitted by the source of supply 201, a laser of this kind being very sensitive to temperature. These circuits are well known to those versed in the art. For a laser diode transmitting in the infrared range at a wavelength of 1.3 micrometers for example, a light energy of 4 milliwatt is obtained with a supply intensity of 200 milliamps.

An oscillator 202 provides a signal at comparatively high frequency, for example 100 KHz. This signal is added to a direct or slightly variable signal in an amplifier 203 which delivers a voltage VG fed to the solenoid 110.

A biasing voltage generator 204 enables to supply the biasing voltage of the photodiode 109 which, upon detecting the light beam, supplies the signal VS. This signal VS is amplified in a selective amplifier 205 centred on the frequency of the signal supplied by the oscillator 202.

The output signal of this amplifier 205 is compared to the output signal of the oscillator 202 in a synchronous detector which measures both the amplitude of the signal at the fundamental frequency and its phase change whilst this amplitude passes through zero. This detector supplies an error signal.

This error signal is fed to a servomechanism 207 which for example comprises a voltage generator and a corrective filter which permits generation of a feedback voltage which upon being fed to the solenoid 110 via the amplifier 203, tends to cancel the error signal issuing from the comparator 210 by balancing the magnetic field which is to be measured within the YIG layer 103.

To obtain the value of the magnetic field which is to be measured, the value of the magnetic balancing field is measured by means of the value of the signal which generates the same and which is applied by the servomechanism 207 to the amplifier 203. A measuring instrument 208 is inserted between the servomechanism 207 and the amplifier 203, for this purpose.

In the modified forms illustrated in FIGS. 4 and 5, the control circuits also comprise a source 210 of current i intended to flow in the electrode 113 (or the electrodes 1130 and 1131) needed to generate the transverse magnetic field within the material 103.

The present invention is not only limited to the embodiments which have been described but encompasses all measuring head configurations in which the polarised light transmission-reception elements are coupled to the active material via its section by means of a bidirectional optical coupling, the guided wave performing an outward and return travel in this material.

What is claimed is:

1. Measuring head for a magnetometer comprising:
   a plane layer of a magnetic material;
   laser diode means for producing a beam of linearly polarized light, said linearly polarized light beam directed to said plane layer for guided propagation of said beam within said plane layer parallel to the plane surfaces of said plane layer, said beam undergoing a rotation of the direction of polarization during said guided propagation within said plane layer;
   photodiode means for measuring said rotation of the direction of polarization;
   a common optical fibre for coupling said beam to a proximate edge of said plane layer;
   said plane layer comprising an extremity opposite said proximate edge at which is provided a means for reflecting the beam so as to cause the beam to travel outwards and back within the magnetic material plane layer before reinjection into the common optical fibre and transmission to the means for measuring the rotation of the direction of polarization; and
   optical means having a preferential optical axis, for coupling said laser diode means and said photodiode means, comprising,
   means for linearly polarizing the beam transmitted and inserting the linearly polarized beam into the common optical fibre,
   means for receiving from the common optical fibre the beam retransmitted by the magnetic material layer, and,
   means for separating the beam received into two components having polarizations which are respectively parallel and orthogonal to the said preferential optical axis and transmitting the orthogonal component to the photodiode means.

2. Measuring head according to claim 1, in which the optical means having a preferential optical axis comprise a cube formed by the joining of two right-angled prisms of refractive material to define a separation surface formed by the hypotenuse of the two prisms, said separation surface treated in such a manner as to be a polarization separator.

3. Measuring head according to claim 2, furthermore comprising a separator joined to said cube and comprising an element for rotation of polarization associated with a polarizer element deposited on its input surface for receiving the beam transmitted by the laser diode and imparting to the beam transmitted by the polarizer element a polarizing rotation of $\pi/4$ radians, wherein the optical means are spatially arranged in such a manner that the preferential optical axis coincides with the direction of polarization of the beam coming from the said separator element.

4. Measuring head according to claim 1, in which the optical means having a preferential optical axis comprises a GLAN prism.

5. Measuring head according to claim 1, in which the magnetic material layer is carried by a substrate situated on a support plate and integral with means for coupling the common optical fibre with the layer of magnetic material, said coupling means being provided with a reference location wherein rests the fibre which is to be coupled.

6. Measuring head according to claim 1, in which the means for measuring the rotation also comprise:
   a coil and means for producing a current within said coil, thereby enabling to induce within the magnetic material plane layer a magnetic field parallel to the plane of said plane layer and parallel to the direction of propagation of the guided beam.

7. Measuring head according to claim 1, also comprising:
   induction means for inducing within the magnetic material layer a magnetic field parallel to the plane of this layer and at right angles to the direction of propagation of the light beam.

8. Measuring head according to claim 7, in which said induction means comprise:
   two permanent magnets situated at either side of the magnetic material plane layer.

9. Measuring head according to claim 7, in which said induction means comprise:

a plane electrode of electrically conductive material completely covering the magnetic material plane layer and separated from said magnetic material plane layer by an insulating layer of dielectric material, and means for establishing a direct current in said plane electrode, said direct current flowing from one end to the other along a direction parallel to the direction of propagation of the beam.

10. Measuring head according to claim 7, in which said induction means comprise:

two plane electrodes of electrically conductive material situated on the magnetic material plane layer at either side of a central axis parallel to the direction of propagation of the beam, in such a manner as to leave uncovered a central strip of the magnetic material plane layer forming a waveguide for said beam, and means for establishing a direct current in said two plane electrodes flowing from one end to the other in a direction parallel to the direction of propagation of the beam.

11. Measuring head according to claim 1, in which the means for reflecting the guide beam are formed by a mirror formed by metalizing the edge of the magnetic material plane layer.

12. Measuring head according to claim 1, in which the magnetic material is an yttrium and iron garnet epitaxied on to a garnet of gadolinium and of gallium having a thickness comprised between 5 and 110 micrometers.

13. Measuring head according to claim 1, in which the wavelength of the polarized light is substantially 1.3 micrometer.

14. Magnetometer intended to measure a magnetic field, comprising:

means for generating a magnetic field opposed to the field which is to be measured;

means for generating an alternating magnetic field superimposed on the opposed magnetic field; and means for measuring the rotation of the plane of polarization of a light beam under the action of these three fields, and means for adjusting the opposed field to the same value as the field which is to be measured by detecting the disappearance of the odd harmonics of the frequency of the alternating field during the variations of the rotation of the polarization of the light beam;

further comprising a measuring head comprising:

a plane layer of a magnetic material;

laser diode means for producing a beam of linearly polarized light, said linearly polarized light beam directed to said plane layer for guided propagation of said beam within said plane layer parallel to the plane surfaces of said plane layer, said beam undergoing a rotation of the direction of polarization during said guided propagation within said plane layer;

photodiode means for measuring said rotation of the direction of polarization;

a common optical fibre for coupling said beam to a proximate edge of said plane layer;

said plane layer comprising an extremity opposite said proximate edge at which is provided a means for reflecting the beam so as to cause the beam to travel outwards and back within the magnetic material plane layer before reinjection into the common optical fibre and transmission to the means for measuring the rotation of the direction of polarization; and optical means having a preferential optical axis, for coupling said laser diode means and said photodiode means, comprising:

means for linearly polarizing the beam transmitted and inserting the linearly polarized beam into the common optical fibre, means for receiving from the common optical fibre the beam retransmitted by the magnetic material layer, and, means for separating the beam received into two components having polarizations which are respectively parallel and orthogonal to the said preferential optical axis and transmitting the orthogonal component to the photodiode means.

* * * * *